(12) United States Patent
Mori et al.

(10) Patent No.: US 10,203,396 B2
(45) Date of Patent: Feb. 12, 2019

(54) MEASUREMENT ERROR CORRECTION METHOD AND ELECTRIC COMPONENT PROPERTY MEASUREMENT DEVICE

(71) Applicant: MURATA MANUFACTURING CO., LTD., Kyoto-fu (JP)

(72) Inventors: Taichi Mori, Nagaokakyo (JP); Satoshi Kageyama, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 272 days.

(21) Appl. No.: 15/255,527

(22) Filed: Sep. 2, 2016

(65) Prior Publication Data

US 2016/0370448 A1    Dec. 22, 2016

Related U.S. Application Data

(63) Continuation of application No. PCT/JP2015/054337, filed on Feb. 17, 2015.

(30) Foreign Application Priority Data

Mar. 4, 2014   (JP) ................................. 2014-041184

(51) Int. Cl.
*G01R 27/28* (2006.01)
*G01R 35/00* (2006.01)
*G01R 27/32* (2006.01)

(52) U.S. Cl.
CPC ........... *G01R 35/007* (2013.01); *G01R 27/28* (2013.01); *G01R 27/32* (2013.01); *G01R 35/00* (2013.01)

(58) Field of Classification Search
None
See application file for complete search history.

(56) References Cited

U.S. PATENT DOCUMENTS 5,646,536 A  *  7/1997  Ishihara ................. G01R 27/32
                                                     324/601
8,713,490 B1 *  4/2014  Allen-Ware ........ G06F 17/5009
                                                     700/108
(Continued)

FOREIGN PATENT DOCUMENTS

JP            3558086 B1    8/2004
JP         2007-519892 A    7/2007
(Continued)

OTHER PUBLICATIONS

International Search Report issued in PCT/JP2015/054337, dated May 26, 2015.
(Continued)

*Primary Examiner* — Paresh H Patel
(74) *Attorney, Agent, or Firm* — Studebaker & Brackett PC

(57) ABSTRACT

A likely value is calculated by a maximum-likelihood method for all coefficients of a relative error correction circuit network model derived by assuming that, for all pairs of two ports selected from among signal line ports related to application or detection of a high frequency signal and non signal line ports other than the signal line ports, there exists a leak signal directly transferred between the ports. A coefficient of a first relative error correction circuit network submodel derived by assuming that, for all pairs of two ports selected only from among signal line ports, there exists a leak signal directly transferred between the ports, and a coefficient for a non signal line port of a second relative error correction circuit network submodel derived by assuming that there exists a signal reflected at a non signal line port are used as initial values.

2 Claims, 9 Drawing Sheets

(56) References Cited

U.S. PATENT DOCUMENTS

2004/0174172 A1* 9/2004 Kamitani ............... G01R 27/28
　　　　　　　　　　　　　　　　　　　　324/500
2004/0222800 A1* 11/2004 Noujeim ............... G01R 27/32
　　　　　　　　　　　　　　　　　　　　324/650

FOREIGN PATENT DOCUMENTS

| JP | 3965701 B2 | 8/2007 |
| JP | 4009876 B2 | 11/2007 |
| JP | 5246172 B2 | 7/2013 |
| JP | 2014041165 A | 3/2014 |

OTHER PUBLICATIONS

Written Opinion issued in PCT/JP2015/054337, dated May 26, 2015.
Kay, Steven M., "Fundamentals of Statistical Signal Processing: Estimation Theory", 1993, pp. 182-189, Prentice Hall PTR, Upper Saddle River, New Jersey, USA.
Hong, Jia-Sheng & Lancaster, M.J., "Microstirp Filters for RF/Microwave Applications", 2001, pp. 20-25, John Wiley & Sons, Inc.

* cited by examiner

MEASUREMENT ERROR CORRECTION METHOD AND ELECTRIC COMPONENT PROPERTY MEASUREMENT DEVICE

CROSS REFERENCE TO RELATED APPLICATIONS

This application claims benefit of priority to Japanese Patent Application 2014-041184 filed Mar. 4, 2014, and to International Patent Application No. PCT/JP2015/054337 filed Feb. 17, 2015, the entire content of which is incorporated herein by reference.

TECHNICAL FIELD

The present disclosure relates to a measurement error correction method and an electric component property measurement device, and particularly relates to a measurement error correction method and an electric component property measurement device that calculate, from a result of measuring an electric property of the electric component while the electric component is mounted on a test jig, an estimation value of the electric property that would be obtained by measurement performed while the electric component is mounted on a reference jig.

BACKGROUND

Conventionally, the electric property of an electric component such as a surface-mount electric component that does not include a coaxial connector has been measured while the electric component is mounted on a measurement jig including a coaxial connector and a coaxial cable connects the measurement jig and a measurement device. In such a measurement, a measurement error is caused by variation in property between individual measurement jigs as well as variation in property between individual coaxial cables and measurement devices.

Measurement of the coaxial cable and the measurement device is performed while the measurement device is connected with a standard having a reference property through the coaxial cable. This allows identification of an error occurring between the head of the coaxial cable connected with the standard and the measurement device.

However, for the measurement jig, it is impossible to accurately identify an error in electric property between a connection terminal in a part at which the electric component is mounted and the coaxial connector for connecting the coaxial cable. It is also difficult to adjust measurement jigs to have identical properties. In particular, it is significantly difficult to adjust measurement jigs to have identical properties over a wide bandwidth.

To solve these problems, what is called a relative error correction method has been disclosed that performs measurement while a correction data acquisition specimen is mounted on a plurality of measurement jigs to previously derive, from variation in measurement values between the measurement jigs, an expression for correcting a relative error between a measurement jig (hereinafter referred to as a "reference jig") and another measurement jig (hereinafter referred to as a "test jig"), and calculates, for the electric property of any given electric component, using the expression from a measurement value (test jig measurement value) measured while the electric component is mounted on the test jig, an estimation value of a measurement value (test jig measurement value) measured while the electric component is mounted on the reference jig.

For example, in a relative error correction method disclosed in Japanese Patent No. 3558086, a "relative error correction adapter" obtained by deriving, for each port, a scattering matrix obtained by synthesizing a scattering matrix of error of the reference jig and a scattering matrix for removing (canceling) error of the test jig is used as the expression for correcting the relative error between the reference jig and the test jig. The estimation value of the reference jig measurement value of the specimen is calculated by synthesizing the relative error correction adapter with a scattering matrix of the test jig measurement value of an optional specimen. The relative error correction adapter can be calculated from a result of measuring at least three one-port standard specimens with both of the reference jig and the test jig for each port.

The relative error correction method disclosed in Japanese Patent No. 3558086 employs a relative error correction circuit network model derived by assuming that there exists only a signal line port connected with a signal line related to application or detection of a high frequency signal. Influence of non signal line ports such as GND and power ports other than signal line ports is omitted in the relative error correction circuit network model. However, in reality, any difference exists between non-RF ports included in measurement jigs, and thus such omission is a major factor of a residual error in relative error correction.

To solve such a problem, Japanese Patent No. 4009876 discloses a relative error correction method that measures a non-RF port through the test jig and calculates the estimation value of the reference jig measurement value obtained without measurement of the non-RF port. The number of ports included in a standard specimen to be prepared for connection with RF ports and necessary for performing the relative error correction method disclosed in Japanese Patent No. 4009876 needs to equal the number of non-RF ports.

In the relative error correction methods disclosed in Patent Japanese Patent No. 3558086 and Japanese Patent No. 4009876, a signal (hereinafter referred to as an "inter-port leakage signal") transferred from a measurement jig not through a DUT but directly between ports within the measurement jig is omitted in the relative error correction circuit network model. However, in reality, any inter-port leakage signal exists in the measurement jig, and thus such omission is a major factor of a residual error in relative error correction.

To solve the above-described problem, Japanese Patent No. 5246172 discloses a relative error correction method that can also correct a difference in the inter-port leakage signal between measurement jigs in measurement of optional N ports equal to or larger than two ports. The number of ports included in a standard specimen to be prepared for the measurement of optional N ports and necessary for performing the relative error correction method disclosed in Japanese Patent No. 5246172 needs to equal the number, which is at least five, of measurement ports having different properties.

SUMMARY

Problem to be Solved by the Disclosure

In measurement of an electric component, difference in measurement values occur between measurement jigs used for the measurement. The following three factors are thought to be responsible for the difference in measurement values between measurement jigs.

(a) Transmission path difference: difference in signal transmission properties of ports, (b) direct wave difference: difference in signal leakage properties between ports, and (c) existence of non-transmission path: existence of a non signal line port (GND port or power port) other than a signal line port related to application or detection of a high frequency signal.

The conventional technology disclosed in Japanese Patent No. 3558086 corrects a measurement error with (a) taken into account. The conventional technology disclosed in Japanese Patent No. 4009876 corrects a measurement error with (a) and (c) taken into account. The conventional technology disclosed in Japanese Patent No. 5246172 corrects a measurement error with (a) and (b) taken into account. However, the conventional technologies disclosed in Japanese Patent No. 3558086, Japanese Patent No. 4009876 and Japanese Patent No. 5246172 are unable to simultaneously correct the three of (a), (b), and (c). Thus, theoretically, a correction error always remains even in an ideal state in which there is no error between measurement jigs.

The present disclosure provides a measurement error correction method and an electric component property measurement device that can accurately correct differences in measurement values between measurement jigs, taking into account the three factors (transmission path difference, direct wave difference, and non-transmission path difference) that cause the differences in measurement values between the measurement jigs.

Means for Solving the Problem

To solve the above-described problems, the present disclosure provides a measurement error correction method configured as described below.

A measurement error correction method for an electric property of an electric component including a signal line port connected with a signal line related to application or detection of a high frequency signal and a non signal line port other than the signal line port is configured to calculate, from a result of performing measurement while the electric component is connected with a test jig capable of measuring the signal line and the non signal line port, an estimation value of the electric property of the electric component that would be obtained by performing measurement while the electric component is connected with a reference jig capable of measuring the signal line port only. The measurement error correction method includes first to fifth steps. The first step obtains a first measurement value by measuring an electric property for at least one of signal line ports and at least one of non signal line ports of each of at least three kinds of correction data acquisition specimens having equivalent electric properties while the correction data acquisition specimen is connected with the test jig, and measuring an electric property for at least one of signal line ports of each correction data acquisition specimen while the correction data acquisition specimen is connected with the reference jig. The second step obtains a second measurement value by preparing a correction data acquisition through-device electrically connected with the at least one of signal line ports and the at least one of non signal line ports, measuring the signal line port and the non signal line port while the correction data acquisition through-device is connected with the test jig, and measuring the signal line port while the correction data acquisition through-device is connected with the reference jig. The third step determines, based on the first measurement value and the second measurement value, an expression for calculating an estimation value of the electric property of the electric component that would be obtained by measuring the signal line port while the electric component is connected with the reference jig, from a result of measuring the signal line port and the non signal line port while the electric component is connected with the test jig. The fourth step measures the signal line ports and the non signal line ports of any given electric component while the electric component is connected with the test jig. The fifth step calculates, by using the expression determined in the third step based on measurement values obtained in the fourth step, an estimation value of the electric property of the electric component that would be obtained by measuring the signal line port while the electric component is connected with the reference jig. The expression determined in the third step is obtained using a relative error correction circuit network model derived by assuming that, in each of the reference jig and the test jig, there exists, for all pairs of two ports selected from among the signal line ports and the non signal line ports, a leak signal not transferred to the electric component connected with the two ports but directly transferred between the two ports, in addition to a signal transferred within each of the signal line ports and the non signal line ports. The third step includes first to third substeps. The first substep calculates, based on the first measurement value, a first coefficient of a first relative error correction circuit network submodel derived by assuming that, in each of the reference jig and the test jig, there exists, for all pairs of two ports selected only from among the signal line ports, the leak signal not transferred to the electric component connected with the two ports but directly transferred between the two ports, in addition to a signal transferred within each signal line port. The second substep calculates, based on the second measurement value, a second coefficient other than the coefficient corresponding to the first coefficient among coefficients of a second relative error correction circuit network submodel derived by assuming that, in each of the reference jig and the test jig, there exists a signal reflected at the non signal line port in addition to the assumption for the first relative error correction circuit network model. The third substep calculates, using the first and second coefficients as initial values of the coefficients corresponding to the first and second coefficients among the coefficients of the relative error correction circuit network model and using predetermined values as initial values of the other coefficients, likely values for all of the coefficients of the relative error correction circuit network model by a maximum-likelihood method using the first and second measurement values, and determines the expression by using the calculated likely values.

The relative error correction circuit network model used in the above-described method assumes that there exists, for all pairs of two ports selected from among the signal line ports and the non signal line ports, the leak signal not transferred to an electric component connected with the two ports but directly transferred between the two ports, in addition to a signal transferred within each of the signal line ports and the non signal line ports. Accordingly, any error in a measurement value of the electric property of the electric component can be corrected considering the three factors (transmission path difference, direct wave difference, and non-transmission path difference) that cause differences in measurement values between measurement jigs.

The present disclosure also provides an electric component property measurement device configured as described below.

An electric component property measurement device is configured to perform, for an electric component including a signal line port connected with a signal line related to application or detection of a high frequency signal and a non signal line port other than the signal line port, measurement of the signal line port and the non signal line port while the electric component is connected with a test jig capable of measuring the signal line and the non signal line port, and calculate, from a result of the measurement, an estimation value of the electric property of the electric component that would be obtained by measuring the signal line port while the electric component is connected with a reference jig capable of measuring the signal line port only. The electric component property measurement device includes (a) a measurement unit configured to measure the signal line port and the non signal line port while the electric component is connected with the test jig, (b) an expression storage unit configured to store therein a value of a coefficient of an expression determined for calculating, based on a first measurement value acquired by measuring an electric property for at least one of signal line ports of each of at least three kinds of correction data acquisition specimens having equivalent electric properties while the correction data acquisition specimen is connected with the test jig and while the correction data acquisition specimen is connected with the reference jig, and a second measurement value acquired by measuring the signal line port and the non signal line port while a correction data acquisition through-device electrically connected with at least one of signal line port and at least one of non signal line port is connected with the test jig and measuring the signal line port while the correction data acquisition through-device is connected with the reference jig, an estimation value of the electric property of the electric component that would be obtained by measuring the signal line ports while the electric component is connected with the reference jig from a result of measuring the signal line port and the non signal line port while the electric component is connected with the test jig, and (c) an electric property estimation unit configured to read the value of the coefficient stored in the expression storage unit from a measurement value obtained for any given electric component by measurement at the measurement unit, and calculate, using the expression, an estimation value of the electric property of the electric component that would be obtained by measuring the signal line ports while the electric component is connected with the reference jig. The value of the coefficient stored in the expression storage unit (A) is a value of a coefficient of a relative error correction circuit network model derived by assuming that, in each of the reference jig and the test jig, there exists, for all pairs of two ports selected from among the signal line ports and the non signal line ports, a leak signal not transferred to the electric component connected with the two ports but directly transferred between the two ports, in addition to a signal transferred within each of the signal line ports and the non signal line ports, and (B) is, for all of the coefficients of the relative error correction circuit network model, a likely value calculated by a maximum-likelihood method based on the first and second measurement values by using (i) the first coefficient calculated based on the first measurement value as an initial value of the coefficient of the relative error correction circuit network model corresponding to a first coefficient of a first relative error correction circuit network submodel derived by assuming that, in each of the reference jig and the test jig, there exists, for all pairs of two ports selected only from among the signal line ports, the leak signal not transferred to the electric component connected with the two ports but directly transferred between the two ports, in addition to a signal transferred within each signal line port, (ii) the second coefficient calculated based on the second measurement value as an initial value of the coefficient of the relative error correction circuit network model corresponding to a second coefficient other than the coefficient corresponding to the first coefficient among the relative error correction circuit network models corresponding to a coefficient for the non signal line port of a second relative error correction circuit network submodel derived by assuming that, in each of the reference jig and the test jig, there exists a signal reflected at the non signal line port in addition to the assumption for the first relative error correction circuit network model, and (iii) predetermined values as initial values of the other coefficients of the relative error correction circuit network model.

The above-described configuration can highly accurately correct any error in a measurement value of the electric property of an electric component by using an expression obtained by taking into account the three factors (transmission path difference, direct wave difference, and non-transmission path difference) that cause differences in measurement value between measurement jigs.

Advantageous Effect of the Disclosure

The present disclosure can accurately correct differences in measurement values between measurement jigs taking into account three factors of transmission path difference, direct wave difference, and non-transmission path difference, which cause differences in measurement values between measurement jigs.

DETAILED DESCRIPTION

An embodiment of the present disclosure will be described below with reference to FIGS. 1 to 11.

Measurement System

Figure 11:
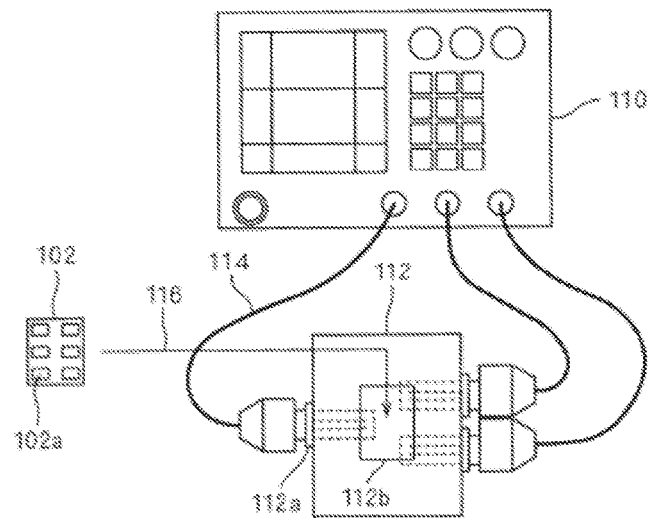
FIG. 11 is an explanatory diagram of a measurement system. (Embodiment 1)

FIG. 11 is an explanatory diagram of a measurement system that measures the electric property of an electric component. As illustrated in FIG. 11, an electric component 102 (for example, a surface acoustic wave filter that is a high-frequency passive electric component) is mounted on a measurement jig 112, when its electric property is measured by an electric component property measurement device (hereinafter referred to as a "measurement device") 110 such as a network analyzer. A coaxial cable 114 connects a coaxial connector 112a of the measurement jig 112 and the measurement device 110. When the electric component 102 is mounted on a mounting unit 112b of the measurement jig 112 as is illustrated with arrow 116, terminals 102a of the electric component 102 are electrically connected with a connection terminal (not illustrated) of the measurement device 110. The measurement device 110 measures the electric property of the electric component 102 by inputting a signal to a terminal among the terminals 102a of the electric component 102 and detecting a signal output from another terminal thereamong.

The measurement device 110 performs arithmetic processing on measurement data in accordance with a predetermined program to calculate the electric property of the electric component 102. In this case, the measurement device 110 reads necessary data such as a measurement value and a coefficient used for calculation from, for example, an internal memory and a recording medium, or from an external device (for example, a server) through communication. The measurement device 110 may be configured as a plurality of separate devices. For example, the measurement device 110 may be divided into a measurement unit configured to perform measurement only, and a calculation unit configured to receive inputting of measurement data and perform arithmetic processing and validity determination.

The measurement device 110 only needs to include an expression storage unit such as a memory and an electric property estimation unit such as a CPU. The expression storage unit stores data (values of coefficients of a relative error correction circuit network model) of expressions used in a relative error correction method to be described later in detail. The electric property estimation unit calculates an estimation value of a reference jig measurement value for any given electric component using this data. In other words, the measurement device 110 may be configured to (a) determine the expressions used in the relative error correction method by performing measurement and calculation itself, (b) determine the expressions used in the relative error correction method by using data measured by another measurement device, or (c) store, in the expression storage unit, data of the expressions used in the relative error correction method, which is determined by another measurement device, and calculate, through the electric property estimation unit, an estimation value of the reference jig measurement value for any given electric component using the data.

It is difficult to manufacture a plurality of the measurement jigs 112 having an identical property.

For this reason, measurements of the same electric component 102 yield different measurement results when different measurement jigs 112 are used between the measurements because each measurement jig has a property variation. For example, different measurement results are obtained between a measurement jig used to guarantee an electric property for a user and a measurement jig used in measurement for a property-based selection in a process of manufacturing an electric component. Such a measurement value difference between measurement jigs can be corrected by the relative error correction method described below.

Measurement Jig

The following describes measurement jigs (a reference jig 10 and a test jig 20) used in the relative error correction method with reference to FIGS. 1(a) and 1(b).

FIG. 1(a) is an explanatory diagram of the reference jig 10. The reference jig 10 is, for example, a user guarantee measurement jig for guaranteeing the electric property of an electric component for a user, or a shipping examination measurement jig. As illustrated in FIG. 1(a), the reference jig 10 includes a mounting unit 14 and two coaxial connectors 11 and 12. An electric component including two signal terminals and one GND terminal is mounted on the mounting unit 14. The signal terminals of the electric component are each a terminal of a signal line port connected with a signal line related to application or detection of a high frequency signal. The GND terminal of the electric component is a terminal of a non signal line port other than the signal line port. The mounting unit 14 is provided with two signal-line connection terminals 15 and 16 electrically connected with the two signal terminals of the electric component, and a non signal-line connection terminal 17 electrically connected with the GND terminal of the electric component. The coaxial connectors 11 and 12 are electrically connected with the signal-line connection terminals 15 and 16, respectively. The non signal-line connection terminal 17 is connected with the GND. The electric property of the electric component is measured while the coaxial connectors 11 and 12 at ports 1 and 2 of the reference jig 10 are connected with a measurement device such as a network analyzer through coaxial cables, and the electric component is mounted on the mounting unit 14 of the reference jig 10 and connected with the reference jig 10. A measurement value measured in this manner includes an error attributed to the reference jig 10.

FIG. 1(b) is an explanatory diagram of the test jig 20. The test jig 20 is, for example, a measurement jig for a property-based selection process of selecting an electric component having a desired electric property. As illustrated in FIG. 1(b), the test jig 20 includes two signal-line connection terminals 24 and 25 electrically connected with two signal terminals of an electric component 2, a non signal-line connection terminal 26 electrically connected with one GND terminal of the electric component 2, and three coaxial connectors 21, 22, and 23 electrically connected with the two signal-line connection terminals 24 and 25 and the non signal-line connection terminal 26. The connection terminals 24, 25, and 26 at Ports 1, 2, and 3 of the test jig 20 are connected with a measurement device such as a network analyzer through coaxial cables, and the electric property of the electric component 2 is measured while the electric component 2 is connected with the connection terminals 24, 25, and 26 of the test jig 10. A measurement value measured in this manner includes an error attributed to the test jig 20.

The test jig 20 may be provided with the mounting unit 14 as provided to the reference jig 10, or may not be provided with the mounting unit 14. The test jig 20 has less restriction on designing as compared to the reference jig 10, and thus may have a configuration for facilitating mass production.

Relative Error Correction Circuit Network Model

Figure 1:
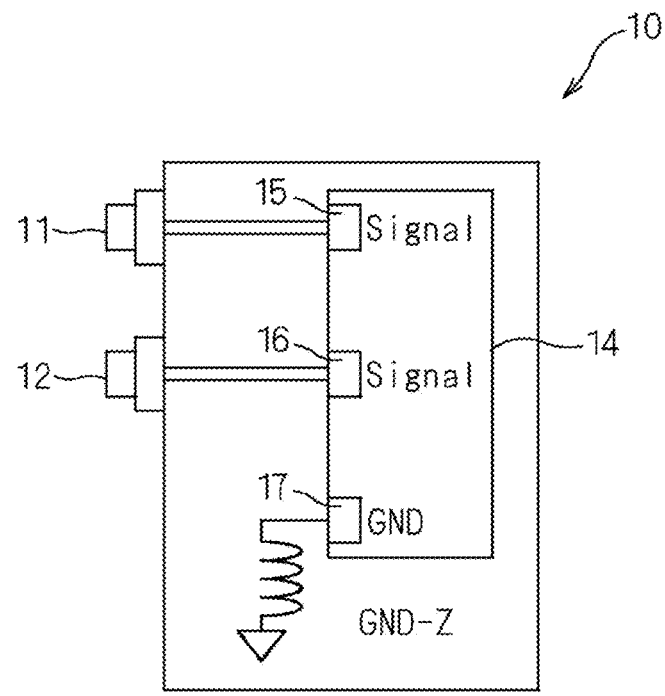
FIG. 1(a) is an explanatory diagram of a reference jig.
FIG. 1(b) is an explanatory diagram of a test jig. (Embodiment 1)
Figure 1:
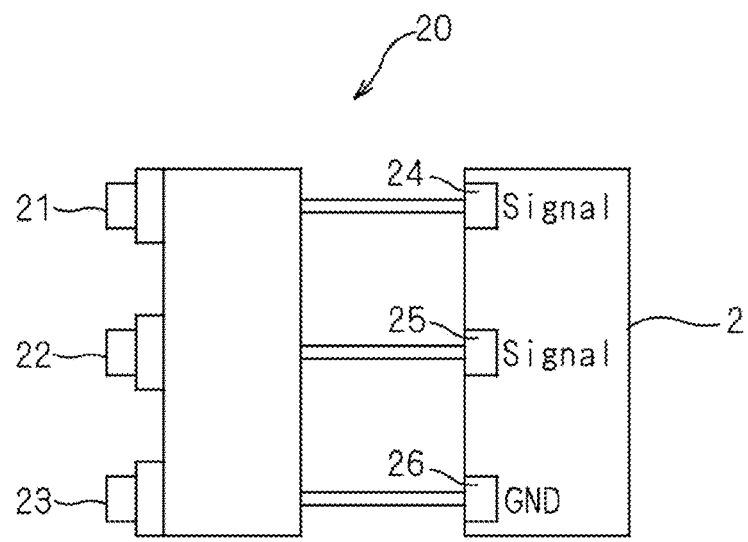
Figure 2A:
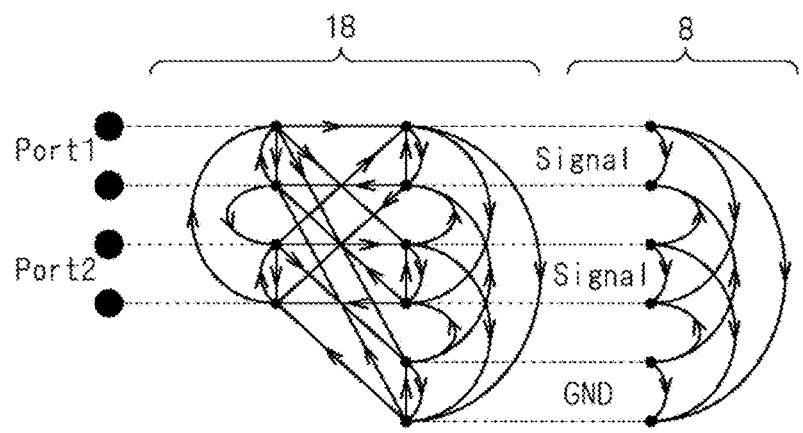
FIG. 2(a) is a signal flow graph in a reference state.
Figure 2B:
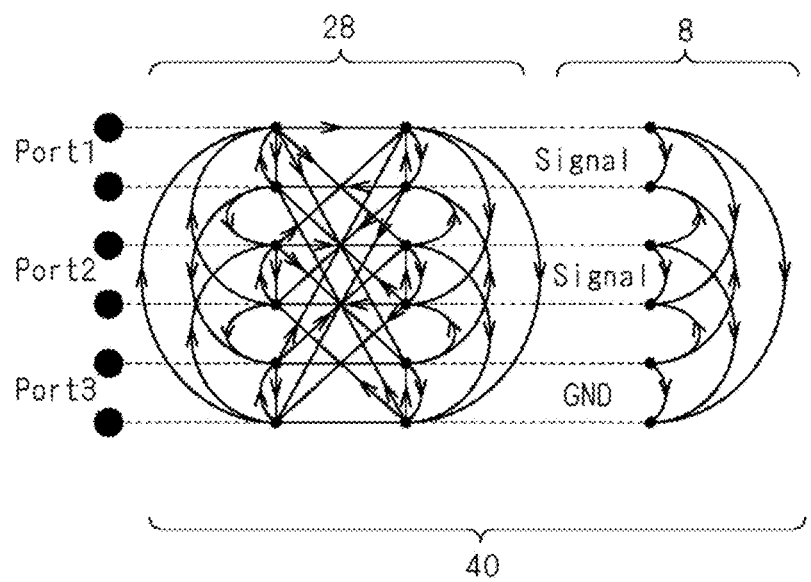
FIG. 2(b) is a signal flow graph in a test state. (Embodiment 1)
Figure 3:
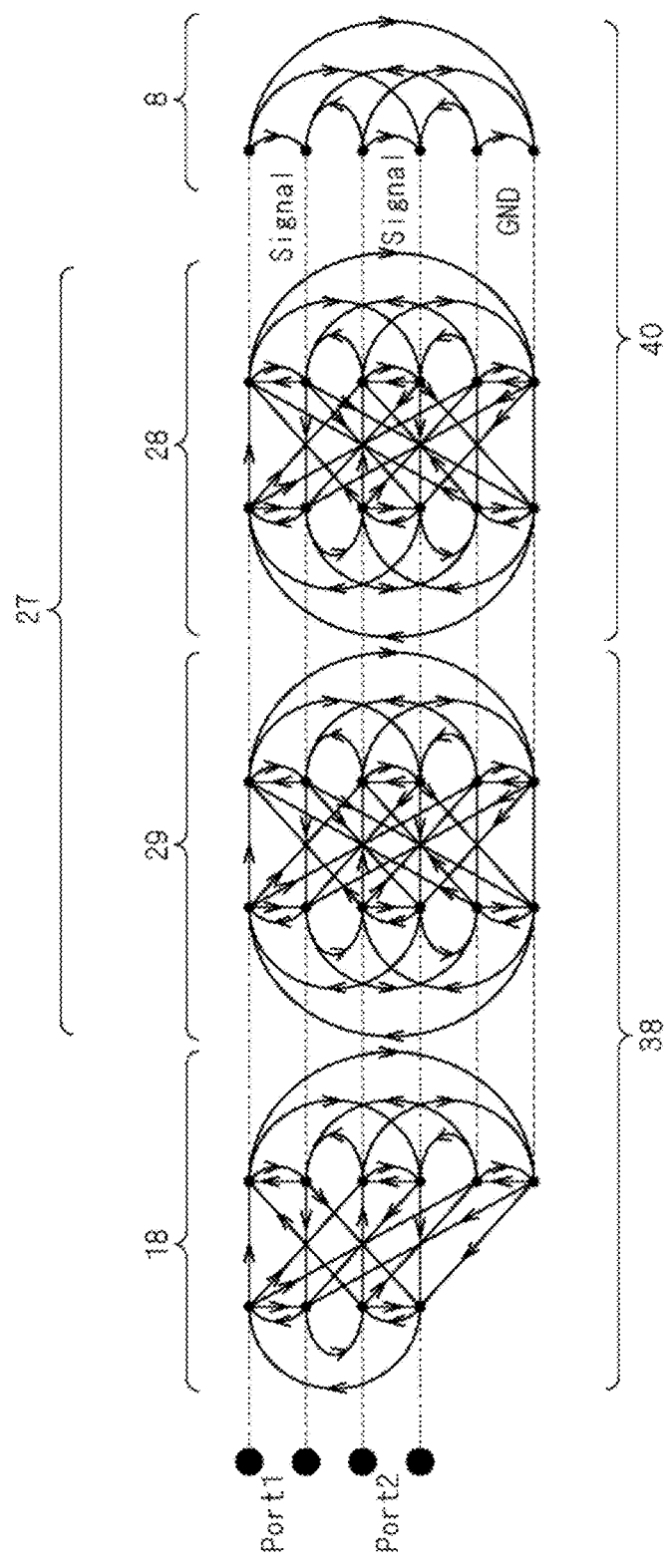
FIG. 3 is a signal flow graph. (Embodiment 1)
Figure 4:
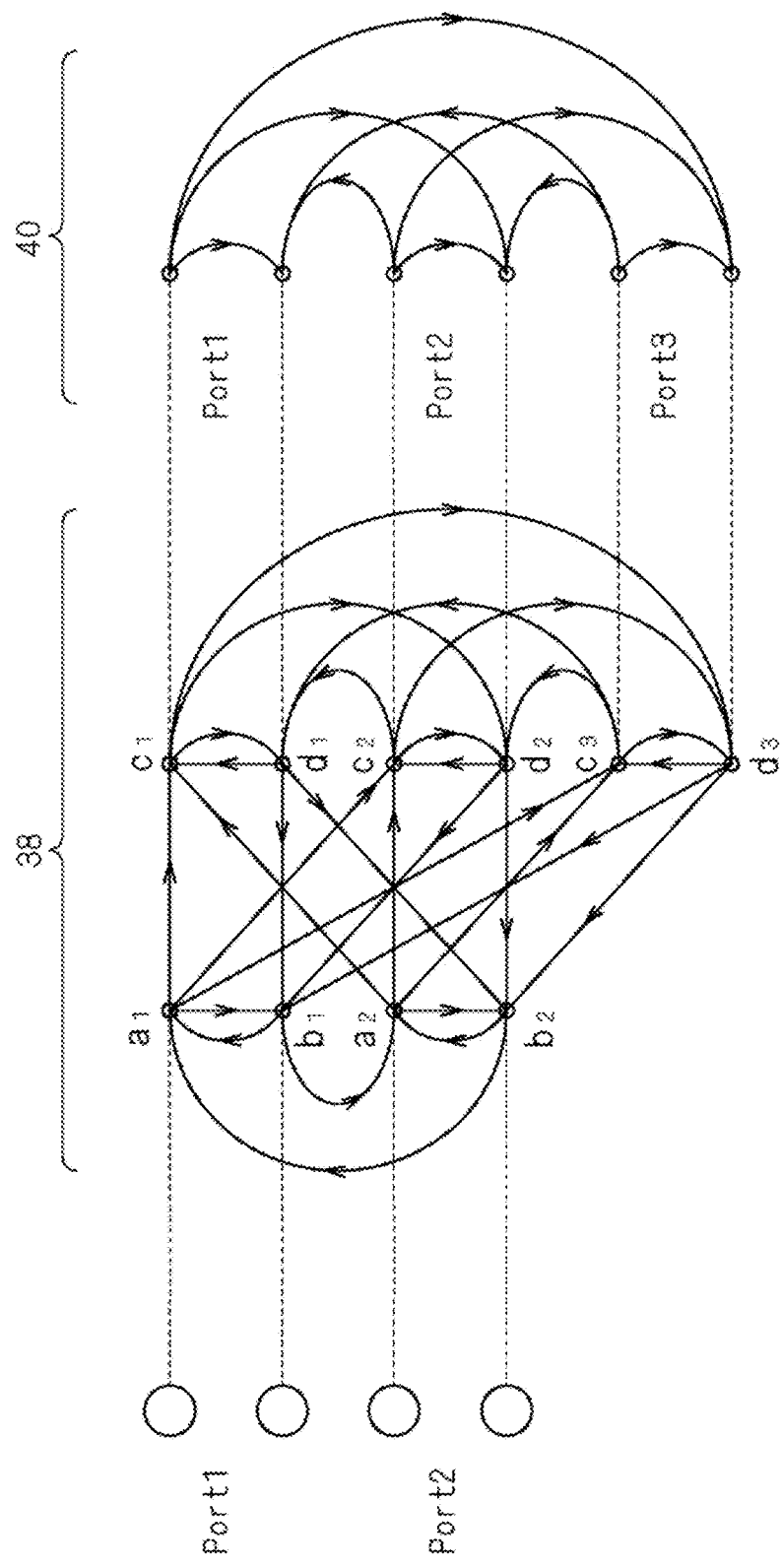
FIG. 4 is a signal flow graph. (Embodiment 1)

The following describes the relative error correction circuit network model with reference to signal flow graphs in FIGS. 2 to 4. Each signal flow is represented by an arrowed solid line segment (branch).

FIG. 2(a) is a signal flow graph in a reference state in which the electric property of an electric component is measured by using a reference jig. As illustrated in FIG. 2(a), a cascade connection is made between a circuit block 18 of the reference jig and a circuit block 8 of the electric component. It is assumed that, in each of the circuit block 18 of the reference jig and the circuit block 8 of the electric component, there exists a signal (inter-port leakage signal) not transferred to another circuit block but directly transferred between different ports, in addition to a signal transferred within an identical port. In the reference state, measurement is performed at Ports 1 and 2, which are signal line ports, but is not performed at Port 3 (GND), which is a non signal line port.

FIG. 2(*b*) is a signal flow graph in a test state in which the electric property of the electric component is measured by using a test jig. As illustrated in FIG. 2(*b*), a cascade connection is made between a circuit block 28 of the test jig and the circuit block 8 of the electric component. It is assumed that, in each of the circuit block 28 of the test jig and the circuit block 8 of the electric component, there exists a signal (inter-port leakage signal) not transferred to another circuit block but directly transferred between different ports, in addition to a signal transferred within an identical port. In the test state, measurement is performed at Port 3 (GND), which is a non signal line port, in addition to Ports 1 and 2, which are signal line ports.

FIG. 3 illustrates that, a cancellation circuit block of the test jig that is configured to remove (cancel) the transmission property of the circuit block 28 of the test jig is connected between the circuit block 18 of the reference jig, and the circuit block 28 of the test jig and the circuit block 8 of the electric component.

Theoretically, the cancellation circuit block 29 of the test jig is obtained by converting the scattering matrix (S parameter) of the circuit block 28 of the test jig into a transmission matrix (T parameter), calculating an inverse matrix of the transmission matrix, and converting the inverse matrix back into a scattering matrix. A part 27 where the cancellation circuit block 29 of the test jig and the circuit block 28 of the test jig are connected provides a cancellation state in which each port has a transmission coefficient of one and a reflection coefficient of zero, and no signal is directly transferred between different ports. Thus, the state illustrated in FIG. 3 is equivalent to a state in which a cascade connection is made between the circuit block 18 of the reference jig and the circuit block 8 of the electric component. In other words, FIG. 3 is equivalent to FIG. 2(*a*).

In FIG. 3, a part 38 where the circuit block 18 of the reference jig and the cancellation circuit block 29 of the test jig are connected is a circuit block 38 of a relative error correction adapter.

FIG. 4 is a signal flow graph obtained by redrawing the signal flow graph in FIG. 3. As illustrated in FIG. 4, the circuit block 38 of the relative error correction adapter is connected with the entire circuit network in the test state illustrated in FIG. 2(*b*), in other words, a circuit block 40 of measurement values in the test state. FIG. 4 is equivalent to FIG. 3 as well as FIG. 2(*a*). Values of nodes $a_1$, $b_1$, $a_2$, and $b_2$ in the left part of the circuit block 38 of the relative error correction adapter are measurement values in the reference state, and values of nodes $c_1$, $d_1$, $c_2$, $d_2$, $c_3$, and $d_3$ in the right part thereof are measurement values in the test state.

Thus, when each coefficient corresponding to an arrowed line segment in the circuit block 38 of the relative error correction adapter is determined and the values of nodes $c_1$, $d_1$, $c_2$, $d_2$, $c_3$, and $d_3$ in the right part of the circuit block 38 of the relative error correction adapter are set to be measurement values in the test state, calculation of the values of nodes $a_1$, $b_1$, $a_2$, and $b_2$ in the left part of the circuit block 38 of the relative error correction adapter yields measurement values in the reference state. In other words, synthesizing the relative error correction adapter with the measurement values in the test state can obtain measurement values in the reference state.

The circuit block 38 of the relative error correction adapter represents the relative error correction circuit network model. The circuit block 38 of the relative error correction adapter, which is the relative error correction circuit network model, is derived on an assumption that, in each of the reference jig and the test jig, there exists, for all pairs of two ports selected only from among signal line ports, a leak signal not transferred to an electric component connected with the two ports but directly transferred between the two ports, in addition to a signal transferred within an identical signal line port, as illustrated in FIGS. 2(*a*) and 2(*b*).

Procedure of Measurement Error Correction Method

Figure 5:
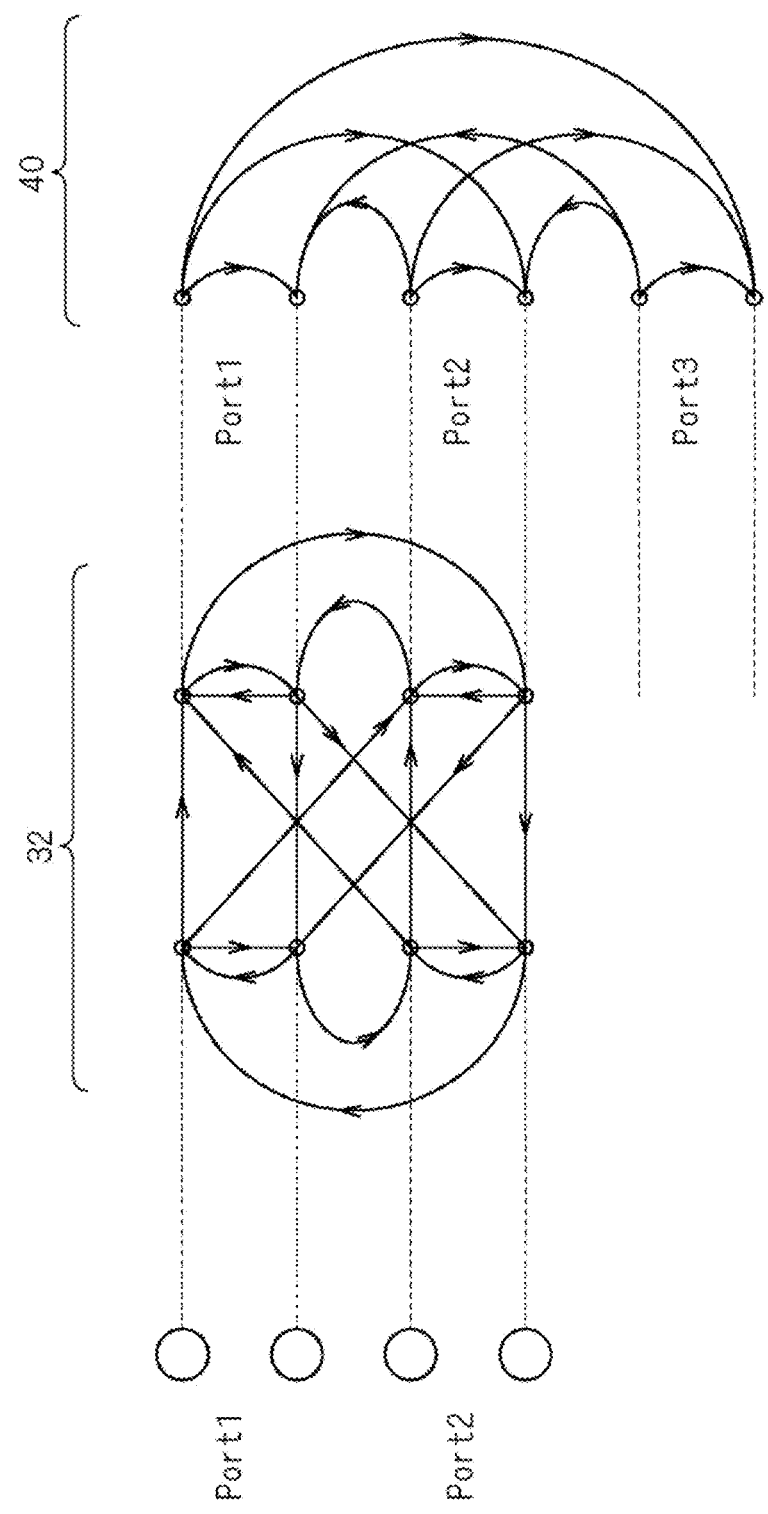
FIG. 5 is a signal flow graph. (Embodiment 1)
Figure 6:
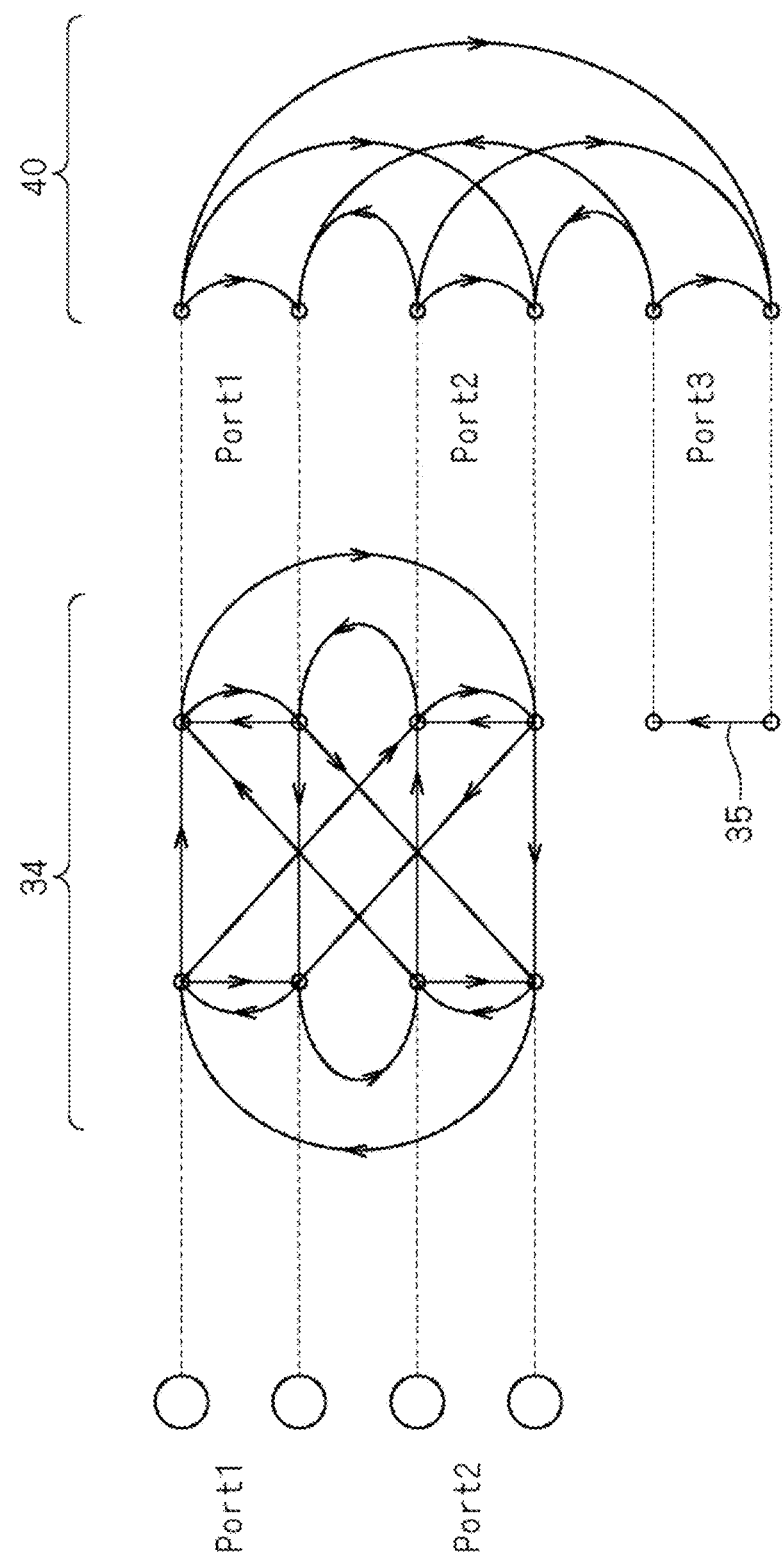
FIG. 6 is a signal flow graph. (Embodiment 1)
Figure 7:
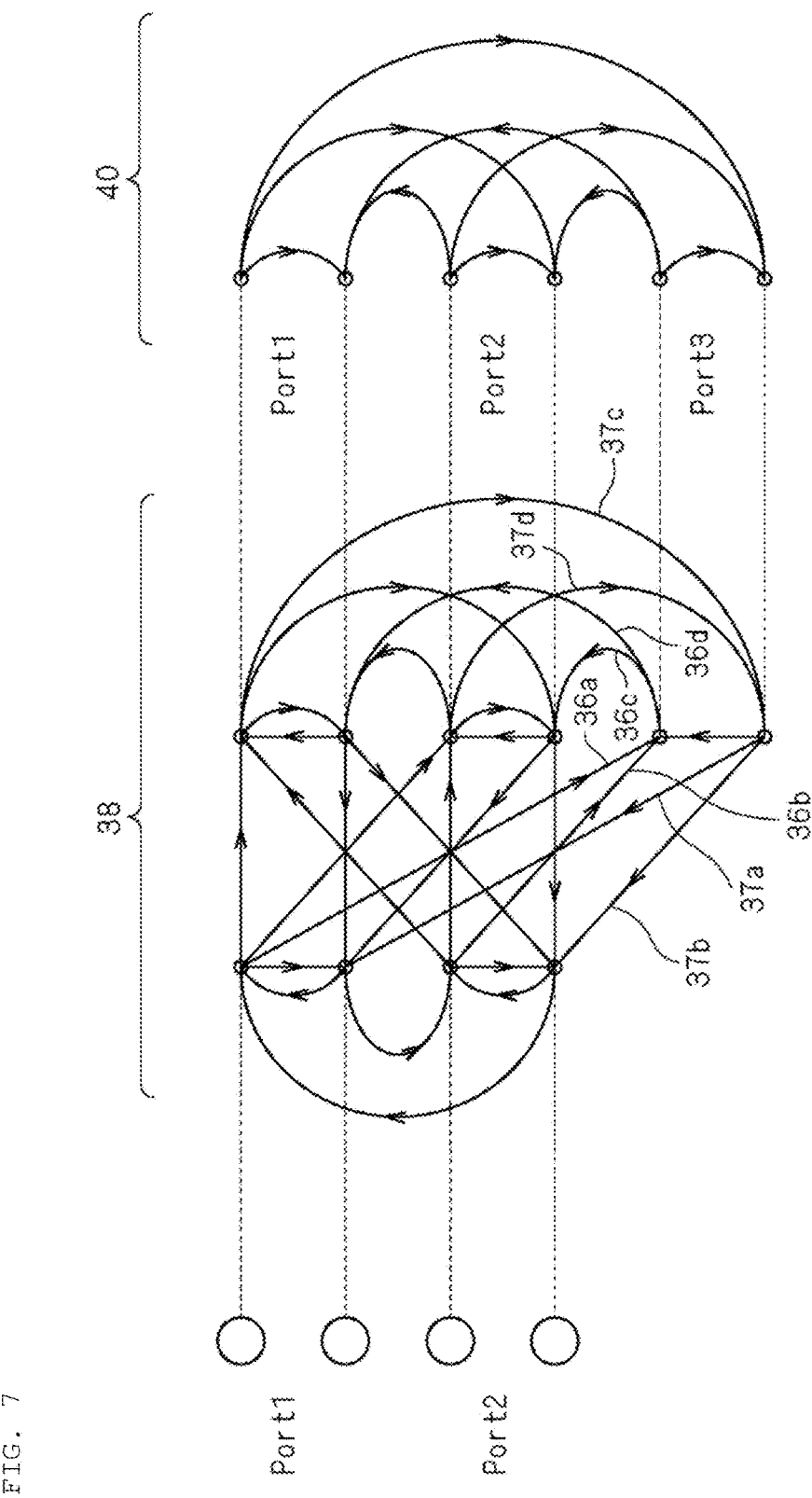
FIG. 7 is a signal flow graph. (Embodiment 1)

The following describes a specific procedure of a measurement error correction method with reference to FIGS. 5 to 7.

(Procedure 1)

First, initial values of a transmission path and a leak error component are derived. FIG. 5 is a signal flow graph illustrating each branch of a circuit block 32 of the relative error correction adapter for which a coefficient is calculated in Procedure 1. As illustrated in FIG. 5, a cascade connection is made between the circuit block 32 of the relative error correction adapter and the circuit block 40 of measurement values in the test state.

The circuit block 32 of the relative error correction adapter is derived by assuming that, in each of the reference jig and the test jig, there exists, for all pairs of two ports selected only from among signal line ports, the leak signal not transferred to an electric component connected with the two ports but directly transferred between the two ports, in addition to a signal transferred within each signal line port. In other words, the derivation is made by assuming a circuit block (signal flow) of the reference jig and a circuit block (signal flow) of the test jig that do not include a branch at least one of the start and end points of which is a non signal port. The circuit block 32 of the relative error correction adapter is a first relative error correction circuit network submodel.

A coefficient corresponding to each branch of the circuit block 32 of the relative error correction adapter, in other words, a coefficient of the first relative error correction circuit network submodel is calculated by the same method as the method disclosed in Japanese Patent No. 5246172.

Specifically, first, a first measurement value is obtained by measuring an electric property for at least one of signal line ports of each of at least three kinds of correction data acquisition specimens having equivalent electric properties while the correction data acquisition specimen is connected with the test jig and while the correction data acquisition specimen is connected with the reference jig. This corresponds to a first step.

Subsequently, the coefficient corresponding to each branch of the circuit block 32 of the relative error correction adapter illustrated in FIG. 5 is calculated based on the obtained first measurement value. This corresponds to a first substep included in a third step.

The coefficient corresponding to each branch of the circuit block 32 of the relative error correction adapter illustrated in FIG. 5 can be easily calculated by converting an S parameter obtained from the first measurement value into a T parameter. Then, the calculated T parameter of the circuit block 32 of the relative error correction adapter is converted into an S parameter.

In the first relative error correction circuit network submodel illustrated in FIG. 5, unlike Japanese Patent No. 5246172, an unnormalized solution of the T parameter needs to be derived for a first relative error correction adapter.

From FIG. 5, the following three Expressions 1 to 3 are obtained.

Expression 1

$$\begin{pmatrix} b_1 \\ b_2 \\ a_1 \\ a_2 \end{pmatrix} = \begin{pmatrix} t_{CA11} & t_{CA12} & t_{CA13} & t_{CA14} \\ t_{CA21} & t_{CA22} & t_{CA23} & t_{CA24} \\ t_{CA31} & t_{CA32} & t_{CA33} & t_{CA34} \\ t_{CA41} & t_{CA42} & t_{CA43} & t_{CA44} \end{pmatrix} \cdot \begin{pmatrix} b_3 \\ b_4 \\ a_3 \\ a_4 \end{pmatrix}$$

Expression 2

$$\begin{pmatrix} b_3 \\ b_4 \end{pmatrix} = S_T \cdot \begin{pmatrix} a_3 \\ a_4 \end{pmatrix}$$

Expression 3

$$\begin{pmatrix} b_1 \\ b_2 \end{pmatrix} = S_D \cdot \begin{pmatrix} a_1 \\ a_2 \end{pmatrix}$$

The T parameter $T_{CA}$ corresponding to a relative correction adapter 32 is given by Expression 4 below.

Expression 4

$$T_{CA} = \begin{pmatrix} t_{CA11} & t_{CA12} & t_{CA13} & t_{CA14} \\ t_{CA21} & t_{CA22} & t_{CA23} & t_{CA24} \\ t_{CA31} & t_{CA32} & t_{CA33} & t_{CA34} \\ t_{CA41} & t_{CA42} & t_{CA43} & t_{CA44} \end{pmatrix}$$

$T_{CA11}$, $T_{CA12}$, $T_{CA21}$, and $T_{CA22}$ represent 2×2 square matrices obtained by dividing $T_{CA}$. Specifically, $T_{CA11}$, $T_{CA12}$, $T_{CA21}$, and $T_{CA22}$ are given by Expression 5 below.

Expressions 5

$$T_{CA11} = \begin{pmatrix} t_{CA11} & t_{CA12} \\ t_{CA21} & t_{CA22} \end{pmatrix} \quad T_{CA12} = \begin{pmatrix} t_{CA13} & t_{CA14} \\ t_{CA23} & t_{CA24} \end{pmatrix}$$
$$T_{CA21} = \begin{pmatrix} t_{CA31} & t_{CA32} \\ t_{CA41} & t_{CA42} \end{pmatrix} \quad T_{CA22} = \begin{pmatrix} t_{CA33} & t_{CA34} \\ t_{CA43} & t_{CA44} \end{pmatrix}$$

Expression 1 can be written as Expressions 6 and 7 below using Expressions 5.

Expression 6

$$\begin{pmatrix} b_1 \\ b_2 \end{pmatrix} = T_{CA11} \cdot \begin{pmatrix} b_3 \\ b_4 \end{pmatrix} + T_{CA12} \cdot \begin{pmatrix} a_3 \\ a_4 \end{pmatrix}$$

Expression 7

$$\begin{pmatrix} a_1 \\ a_2 \end{pmatrix} = T_{CA21} \cdot \begin{pmatrix} b_3 \\ b_4 \end{pmatrix} + T_{CA22} \cdot \begin{pmatrix} a_3 \\ a_4 \end{pmatrix}$$

Substituting Expressions 3 and 7 into Expression 6 yields Expression 8 below.

Expression 8

$$T_{CA11} \cdot \begin{pmatrix} b_3 \\ b_4 \end{pmatrix} + T_{CA12} \cdot \begin{pmatrix} a_3 \\ a_4 \end{pmatrix} = S_D \cdot \left[ T_{CA21} \cdot \begin{pmatrix} b_3 \\ b_4 \end{pmatrix} + T_{CA22} \cdot \begin{pmatrix} a_3 \\ a_4 \end{pmatrix} \right]$$

Substituting Expression 2 into Expression 8 yields Expression 9 below.

$$T_{CA11} \cdot S_T + T_{CA12} = S_D \cdot (T_{CA21} \cdot S_T + T_{CA22}) \qquad \text{Expression 9}$$

Multiplying Expression 9 with $(T_{CA21} \cdot S_T + T_{CA22})^{-1}$ from the right derives Expression 10 below.

$$S_D = (T_{CA11} \cdot S_T + T_{CA12}) \cdot (T_{CA21} \cdot S_T + T_{CA22})^{-1} \qquad \text{Expression 10}$$

Deforming Expression 10 into a linear combination for $T_{CA}$ yields Expressions 11 and 12 below.

Expression 11

$$[(S_T^t \; I_2) \otimes (-I_2 \; S_D)] \cdot t_{CA} = A_{4 \times 16} \cdot t_{CA} = 0$$

Expression 12

$$t_{CA} = cs[T_{CA}] = \begin{pmatrix} t_{CA11} \\ t_{CA21} \\ \vdots \\ t_{CA44} \end{pmatrix}$$

In the above expressions, $$\otimes \qquad \text{Expression 13}$$

represents the Kronecker product, and $$cs[\;] \qquad \text{Expression 14}$$

represents a column expansion.

The superscript t represents a transpose matrix.

$I_2$ is a 2×2 unit matrix. Hereinafter, $I_n$ is defined to be an n×n unit matrix.

Specifically, when the relative error correction adapter is defined by using the T parameter, other coefficients can be normalized with one optional coefficient, which allows definition of a normal equation of the least-squares method. With the S parameter, however, other coefficients cannot be normalized with one optional coefficient, and thus the normal equation is measured to be zero. For this reason, solutions of the least-squares method are values of the rightmost column (related to mapping with the smallest singular value) of the right singular vector of a singular value decomposition.

The relative error correction adapter can be represented by Expression 15 below. Expression 15 can be deformed into Expression 17.

$$T_{CA} = UDV^t \qquad \text{Expression 15}$$

U·V is a 4×16 matrix and have a relation represented by Expression 16 below. D is a diagonal matrix of positive numbers.

Expression 16

$$U^t U = V^t V = I$$

Expression 17

$$T_{CA} = \sum_{k=1}^{K} \alpha_k u_k v_k$$

$\alpha_k$ represents a singular value of $T_{CA}$. $U_k$ is a left singular vector. $V_k$ is a right singular vector.

In this case, a derived solution is the product of the true T parameter and an unknown coefficient A. The true T parameter needs to be known before the S parameter is converted into the T parameter. Thus, the coefficient A is derived by using the reciprocal theorem.

The coefficient A is calculated based on the determination of the T parameter is one when the reciprocal theorem holds. In this case, the number of solutions of the coefficient A is equal to the number of elements of the T parameter, and thus each solution of the coefficient A is used to perform the conversion from the T parameter to the S parameter and select a value of the coefficient A for which the reciprocal theorem ($S_{xy}=S_{yx}$, x≠y) for the S parameter holds.

The relative error correction adapter can be represented by Expression 18 below.

$$T_{CA}=A \cdot T_{CA}' \quad \text{Expression 18}$$

$T_{CA}'$ is the true T parameter.

The coefficient A can be calculated based on a relation represented by Expression 19 below.

$$|T_{CA}|=1 \quad \text{Expression 19}$$

(Procedure 2)

Subsequently, initial values of part of coefficients of the GND port are calculated by the well-known method disclosed in Japanese Patent No. 4009876 using the initial values of a transmission path and a leak signal that are derived in Procedure 1.

FIG. 6 is a signal flow graph illustrating each branch of a circuit block 34 of the relative error correction adapter for which an coefficient is calculated in Procedures 1 and 2. As illustrated in FIG. 6, a cascade connection is made between the circuit block 34 of the relative error correction adapter and the circuit block 40 of measurement values in the test state. The circuit block 34 of the relative error correction adapter includes a branch 35 for the GND port in addition to the circuit block 32 of the relative error correction adapter illustrated in FIG. 5.

The circuit block 34 of the relative error correction adapter is derived by assuming, in each of the reference jig and the test jig, a signal reflected by the GND port, which is a non signal line port, in addition to the assumption for the circuit block 32 of the relative error correction adapter in FIG. 5. The circuit block 34 of the relative error correction adapter is a second relative error correction circuit network submodel.

Procedure 2 calculates a coefficient corresponding to the branch 35 of the circuit block 34 of the relative error correction adapter, in other words, part corresponding to a load match for the GND port. The coefficient corresponding to the branch 35 is, among coefficients of the second relative error correction circuit network submodel, a second coefficient other than a coefficient corresponding to a first coefficient of the first relative error correction circuit network submodel.

Since Japanese Patent No. 4009876 uses the relative error correction circuit network model assuming no leak signal, a reflection coefficient is calculated for each port as the coefficient corresponding to the branch 35. However, since Procedure 2 uses the second relative error correction circuit network submodel derived by assuming the leak signal, the coefficient corresponding to the branch 35 is calculated as one common value, not a value for each port.

Specifically, first, a second measurement value is obtained by preparing a correction data acquisition through-device electrically connected with at least one of signal line ports and at least one of non signal line ports, measuring the signal line port and the non signal line port while the correction data acquisition through-device is connected with the test jig, and measuring the signal line port while the correction data acquisition through-device is connected with the reference jig. This corresponds to a second step.

Subsequently, the coefficient corresponding to the branch 35 of the circuit block 34 of the relative error correction adapter, in other words, a second coefficient of the second relative error correction circuit network submodel is calculated based on the obtained second measurement value. This corresponds to a second substep of the third step.

Specifically, the values determined in Procedure 1 are used as values corresponding to branches other than the branch 35 among branches of the circuit block 34 of the relative error correction adapter illustrated in FIG. 6, and the coefficient corresponding to the branch 35 is set to be unknown. The coefficient corresponding to the branch 35, which is unknown, is calculated based on the second measurement value obtained by measuring the correction data acquisition through-device by using the reference jig and the test jig. The coefficient corresponding to the branch 35 may be calculated based on description in paragraphs [0024] to [0027] of Japanese Patent Application No. 2014-41165 (unpublished Patent Document).

(Procedure 3)

Subsequently, a likely value is derived by a maximum-likelihood method for all coefficients corresponding to the respective branches of the circuit block 38 of the relative error correction adapter illustrated in the signal flow graph in FIG. 7 by using the values calculated in Procedures 1 and 2 as initial values. The values calculated in Procedures 1 and 2 are used as initial values of coefficients corresponding to branches other than branches 36a to 36d and 37a to 37d among the branches of the circuit block 38 of the relative error correction adapter illustrated in FIG. 7. Since values of coefficients corresponding to the branches 36a to 36d and 37a to 37d are not calculated, predetermined values, for example, zeroes are set as the initial values thereof.

The following describes calculation by the maximum-likelihood method in detail.

Measurement values of the k-th standard specimen in the reference state (in which the standard specimen is connected with the reference jig) are represented by a column matrix indicated in Expression 1 in Expression 20 below.

Expression 20

$$s^k = \begin{bmatrix} \text{Re}\{s_{11}^k\} \\ \text{Im}\{s_{11}^k\} \\ \text{Re}\{s_{21}^k\} \\ \text{Im}\{s_{21}^k\} \\ \text{Re}\{s_{12}^k\} \\ \text{Im}\{s_{12}^k\} \\ \text{Re}\{s_{22}^k\} \\ \text{Im}\{s_{22}^k\} \end{bmatrix} \quad \text{Expression 1}$$

Expression 2 in Expression 21 below represents difference between the measurement values of the k-th standard specimen in the reference state and values obtained by correcting the measurement values of the k-th standard specimen in the test state (in which the standard specimen is connected with the test jig) to measurement values in the reference state through a relative error correction adapter x.

$$h^k(x)=s^k-g^k(x)+w^k \quad \text{Expression 21}$$

Expression 2

Parameters in Expression 2 are defined as follows. In the expression, h represents a residue, s represents a measurement value in the reference state, x represents a coefficient of the relative error correction adapter, g represents a value obtained by performing correction with the coefficient x of the relative error correction adapter, w represents measurement variation (measurement variation when an identical specimen is measured a plurality of times), and k represents a standard specimen number.

Since the circuit block 38 of the relative error correction adapter illustrated in FIG. 7 includes two ports in the right part and three ports in the left part, correction represented by a function g is an asymmetric circuit network calculation of the S parameter. In this calculation, a calculation method disclosed in publicly known literature (for example, LANCASTER, H. MICROSTRIP FILTERS FOR RF/MICROWAVE APPLICATIONS.) is employed. This calculation method involves a relatively simple determinant, which allows fast calculation.

Next, a residue of a combination of N standard specimens is represented as a linear combination of Expression 2 as represented by Expression 3 in Expression 22 below.

Expression 22

$$h(x) = \begin{pmatrix} h^1(x) \\ h^2(x) \\ \vdots \\ h^n(x) \end{pmatrix} = s - g(x) + w \quad \text{Expression 3}$$

According to publicly known literature (for example, KAY, S. M. FUNDAMENTALS OF STATISTICAL SIGNAL PROCESSING: ESTIMATION THEORY), a likelihood function related to h(x) is given by Expression 4 in Expression 23 below. In the expression, $C_w$ represents a covariance matrix when measurement variation w has a normal distribution with an average value of zero.

Expression 23

$$likh(x) = \exp\left(-\frac{1}{2}h(x)^T \cdot C_w^{-1} \cdot h(x)\right) \quad \text{Expression 4}$$

Thus, the coefficient x for which the likelihood function has a maximum value is a likely coefficient x, in other words, a likely value of the coefficient of the relative error correction adapter. Accordingly, the likely value (the left-hand side of Expression 5 in Expression 24 below) of the coefficient of the relative error correction adapter is derived through the right-hand side of Expression 5.

Expression 24

$$\hat{x} = \underset{x}{\operatorname{argmax}}\left(-\frac{1}{2}h(x)^T \cdot C_w^{-1} \cdot h(x)\right) \quad \text{Expression 5}$$

Since the right-hand side of Expression 5 is a non-linear function of x, the solution thereof is derived by a non-linear least-squares method. The Levenberg-Marquardt algorithm (corrected Marquardt algorithm) that is unlikely to diverge and has a high convergence efficiency is used as an algorithm of the non-linear least-squares method.

Procedures 1 and 2 described above calculate all coefficients that can be calculated from measurement values among coefficients of the relative error correction circuit network model. However, this calculation does not take into account all coefficients of the relative error correction circuit network model, and thus has a lower accuracy accordingly. In Procedure 3, the likely value is calculated by the maximum-likelihood method for all coefficients of the relative error correction circuit network model by using the coefficients calculated in Procedures 1 and 2 as initial values.

Specifically, Procedure 3 calculates, using the coefficients of the first and second relative error correction circuit network submodels calculated in Procedures 1 and 2 as initial values of coefficients corresponding to the coefficients of the first and second relative error correction circuit network submodels calculated in Procedures 1 and 2, among the coefficients of the relative error correction circuit network model, and using predetermined values as initial values of other coefficients corresponding to the branches 36a to 36d and 37a to 37d of the circuit block 38 of the relative error correction adapter in FIG. 7, likely values for all coefficients of the relative error correction circuit network model by the maximum-likelihood method using the first and second measurement values, and determines, by using the calculated likely values, an expression for calculating an estimation value of the electric property of the electric component that would be obtained by measuring the signal line port while the electric component is connected with the reference jig, from a result of measuring the signal line port and the non signal line port while the electric component is connected with the test jig. Procedure 3 corresponds to a third substep included in the third step.

(Procedure 4)

A measurement error of any given electric component is corrected by using the likely values of all coefficients of the relative error correction adapter determined in Procedure 3.

Specifically, the signal line port and the non signal line port are measured while any given electric component is connected with the test jig. This corresponds to a fourth step.

Subsequently, for a specimen measured while the specimen is connected with the test jig, an estimation value of the electric property that would be obtained by measuring the signal line port while the specimen is connected with the reference jig is calculated by using the expression determined by calculating the likely values of coefficients in Procedure 3 based on obtained measurement values. This corresponds to a fifth step.

The above-described application of the maximum-likelihood method in Procedure 3 provides three typical effects as follows.

Firstly, a relative error due to signal leakage between ports including a non signal port in a measurement jig can be handled, thereby highly accurately performing relative correction even when error in leakage into the non signal port differs between a reference jig and a test jig. This leads to an increased freedom of designing the measurement jig, thereby achieving a high mass-productivity of the measurement jig.

Secondly, a measurement error can be highly accurately corrected, thereby allowing highly accurate selection of a high-frequency component having a high performance property through a property-based selection process.

Thirdly, for a module in which the property of a high-frequency component is largely affected by other components and substrates due to its reduction in size and thickness, sophistication, and high-functionalization, the electric property of the entire module can be highly accurately estimated by measuring the property of the module before the high-frequency component is mounted thereon, applying the measurement error correction method so as to select a module having a desired property, and mounting the high-frequency component to manufacture the module.

state, and correction results (estimation values of measurement values in the reference state calculated from the measurement values in the test state).

TABLE 2

Table 2 Correction Result Comparison of $S_{21}$

| | TEST STATE | CORRECTION RESULT | REFERENCE STATE | DIFFERENCE (I.L.@2 dB) |
|---|---|---|---|---|
| NO CORRECTION | 0.922 + 0.020j | | 0.996 + 0.039j | 1.112 |
| UP TO PROCEDURE 2 | 0.922 + 0.020j | 0.989 + 0.039j | 0.996 + 0.039j | 0.109 |
| PRESENT METHOD | 0.922 + 0.020j | 0.997 + 0.032j | 0.996 + 0.039j | 0.032 |

EXEMPLARY EXPERIMENT 1

Figure 8:
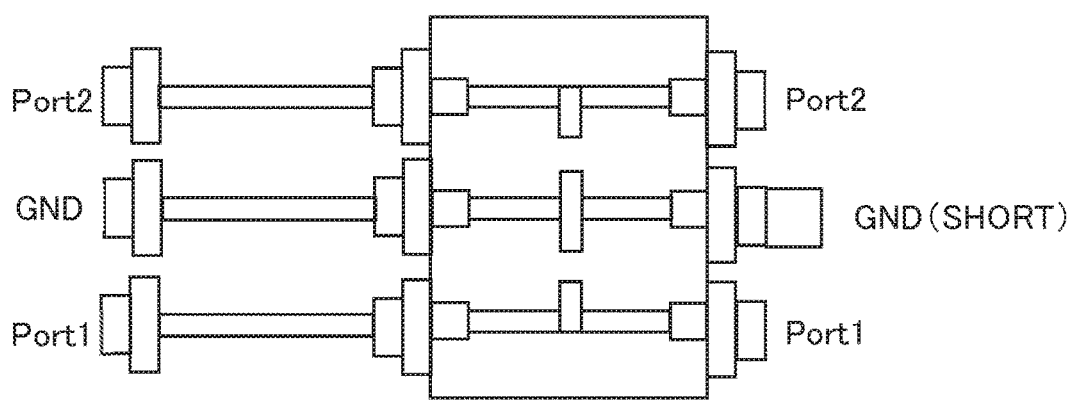
FIG. 8 is a picture of the reference jig. (Embodiment 1)
Figure 9:
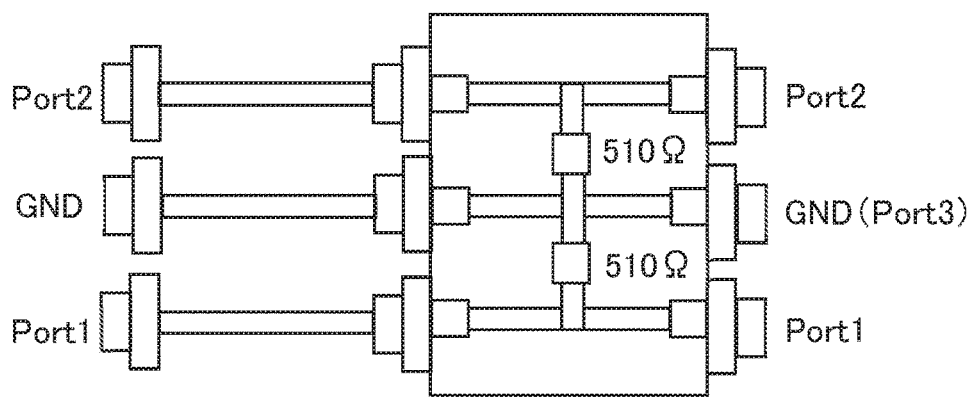
FIG. 9 is a picture of the test jig. (Embodiment 1)
Figure 10:
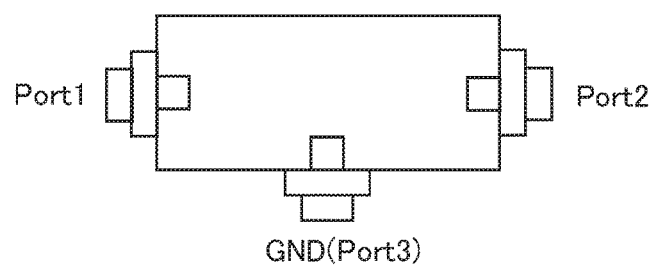
FIG. 10 is a picture of a standard specimen. (Embodiment 1)

Two measurement states (the reference state and the test state) in which a GND terminal of a scratchbuilt substrate had different impedances were configured to check the effect of the measurement error correction method according to the present disclosure. FIG. 8 is a picture of a reference jig. FIG. 9 is a picture of a test jig. FIG. 10 is a picture of a standard specimen.

As illustrated in FIG. 8, the GND port of the reference jig was set to SHORT. As illustrated in FIG. 9, in the test jig, a resistance of 510 Ω was connected between Port 1 and GND and between Port 2 and GND so as to degrade isolation as compared to the reference jig in FIG. 8. As illustrated in FIG. 10, the standard specimen includes three ports of Port 1, Port 2, and GND.

Seven three-port standard specimens (the correction data acquisition specimen and the correction data acquisition through-device) listed in Table 1 below were prepared as scratchbuilt substrates.

TABLE 1

Table 1 Standard specimen properties

| No. | Port 1 | Port 2 | Port 3 (GND) |
|---|---|---|---|
| 1 | OPEN | SHORT | LOAD |
| 2 | LOAD | OPEN | LOAD |
| 3 | SHORT | LOAD | LOAD |
| 4 | SHORT | OPEN | LOAD |
| 5 | THRU | THRU | LOAD |
| 6 | LOAD | OPEN | SHORT |
| 7 | THRU | THRU | THRU |

The following lists other experiment conditions.

(Measurement device) R3860A (manufactured by Advantest Corporation)

(The number of measurement ports) two ports for the reference jig, and three ports for the test jig (Measurement frequency) 300 kHz (Intermediate frequency) 1 kHz (DUT) scratchbuilt substrate (50 Ω microstripline)

The low measurement frequency of 300 kHz is attributable to the instability of a measurement and evaluation system due to attachment and detachment of a connector because a specimen is connected with a jig through the connector as illustrated in FIGS. 8 to 10. The use of the frequency, which is less affected by the instability, allowed execution of a purely theoretical test.

Table 2 below lists measurement values of $S_{21}$ of DUT in the reference state, measurement values thereof in the test state, and correction results (estimation values of measurement values in the reference state calculated from the measurement values in the test state).

Table 2 indicates that, the correction up to Procedure 2, which does not involve the maximum-likelihood method, yields a difference of 0.109 dB between the reference state and a result of correction on a measurement system having different impedances of GND terminals, suggesting insufficient correction. The present method including Procedure 3 yields a difference of 0.032 dB between the correction result and the reference state, which indicates that the correction was accurate.

SUMMARY

As described above, the measurement error correction method for an electric component according to the present disclosure can perform accurate correction of differences in measurement values between measurement jigs, taking into account the three factors (transmission path difference, direct wave difference, and non-transmission path difference) that cause the differences in measurement values between the measurement jigs.

The present disclosure is not limited to the above-described embodiment, but can be carried out with various kinds of modifications.

For example, the present disclosure is applicable to an electric component including optional number of signal line ports and non signal line ports.

The invention claimed is:

1. A measurement error correction method for an electric property of an electric component including a signal line port connected with a signal line related to application or detection of a high frequency signal and a non signal line port other than the signal line port, the method being configured to calculate, from a result of performing measurement while the electric component is connected with a test jig capable of measuring the signal line and the non signal line port, an estimation value of the electric property of the electric component that would be obtained by performing measurement while the electric component is connected with a reference jig capable of measuring the signal line port only, the method comprising:
 a first step of obtaining a first measurement value by measuring an electric property for at least one of signal line ports and at least one of non signal line ports of each of at least three kinds of correction data acquisition specimens having equivalent electric properties while the correction data acquisition specimen is connected with the test jig, and measuring an electric property for at least one of signal line ports of each correction data acquisition specimen while the correction data acquisition specimen is connected with the reference jig;

a second step of obtaining a second measurement value by preparing a correction data acquisition through-device electrically connected with at least one of the signal line ports and at least one of the non signal line ports, measuring the signal line port and the non signal line port while the correction data acquisition through-device is connected with the test jig, and measuring the signal line port while the correction data acquisition through-device is connected with the reference jig;

a third step of determining, based on the first measurement value and the second measurement value, an expression for calculating an estimation value of the electric property of the electric component that would be obtained by measuring the signal line port while the electric component is connected with the reference jig, from a result of measuring the signal line port and the non signal line port while the electric component is connected with the test jig;

a fourth step of measuring the signal line port and the non signal line port of any given electric component while the electric component is connected with the test jig; and a fifth step of calculating, by using the expression determined in the third step based on measurement values obtained in the fourth step, an estimation value of the electric property of the electric component that would be obtained by measuring the signal line port while the electric component is connected with the reference jig, wherein:

the expression determined in the third step is obtained by using a relative error correction circuit network model derived by assuming that, in each of the reference jig and the test jig, there exists, for all pairs of two ports selected from among the signal line ports and the non signal line ports, a leak signal not transferred to the electric component connected with the two ports but directly transferred between the two ports, in addition to a signal transferred within each of the signal line ports and the non signal line ports, and the third step includes:

a first substep of calculating, based on the first measurement value, a first coefficient of a first relative error correction circuit network submodel derived by assuming that, in each of the reference jig and the test jig, there exists, for all pairs of two ports selected only from among the signal line ports, the leak signal not transferred to the electric component connected with the two ports but directly transferred between the two ports, in addition to a signal transferred within each signal line port, a second substep of calculating, based on the second measurement value, a second coefficient other than the coefficient corresponding to the first coefficient among coefficients of a second relative error correction circuit network submodel derived by assuming that, in each of the reference jig and the test jig, there exists a signal reflected at the non signal line port in addition to the assumption for the first relative error correction circuit network model, and a third substep of calculating, using the first and second coefficients as initial values of the coefficients corresponding to the first and second coefficients among the coefficients of the relative error correction circuit network model and using predetermined values as initial values of the other coefficients, likely values for all of the coefficients of the relative error correction circuit network model by a maximum-likelihood method using the first and second measurement values, and determining the expression by using the calculated likely values.

2. An electric component property measurement device configured to perform, for an electric component including a signal line port connected with a signal line related to application or detection of a high frequency signal and a non signal line port other than the signal line port, measurement of the signal line port and the non signal line port while the electric component is connected with a test jig capable of measuring the signal line and the non signal line port, and calculate, from a result of the measurement, an estimation value of the electric property of the electric component that would be obtained by measuring the signal line port while the electric component is connected with a reference jig capable of measuring the signal line port only, the device comprising:

a measurement unit configured to measure the signal line port and the non signal line port while the electric component is connected with the test jig;

an expression storage unit configured to store a value of a coefficient of an expression determined for calculating, based on a first measurement value acquired by measuring an electric property for at least one of signal line ports of each of at least three kinds of correction data acquisition specimens having equivalent electric properties while the correction data acquisition specimen is connected with the test jig and while the correction data acquisition specimen is connected with the reference jig, and a second measurement value acquired by measuring at least one of signal line ports and at least one of non signal line ports while a correction data acquisition through-device electrically connected with the signal line port and the non signal line port is connected with the test jig and measuring the signal line port while the correction data acquisition through-device is connected with the reference jig, an estimation value of the electric property of the electric component that would be obtained by measuring the signal line port while the electric component is connected with the reference jig from a result of measuring the signal line port and the non signal line port while the electric component is connected with the test jig; and an electric property estimation unit configured to read the value of the coefficient stored in the expression storage unit from a measurement value obtained for any given electric component by measurement at the measurement unit, and calculate, using the expression, an estimation value of the electric property of the electric component that would be obtained by measuring the signal line port while the electric component is connected with the reference jig, wherein:

the value of the coefficient stored in the expression storage unit:

is a value of a coefficient of a relative error correction circuit network model derived by assuming that, in each of the reference jig and the test jig, there exists, for all pairs of two ports selected from among the signal line ports and the non signal line ports, a leak signal not transferred to the electric component connected with the two ports but directly transferred between the two ports, in addition to a signal transferred within each of the signal line ports and the non signal line ports, and is, for all of the coefficients of the relative error correction circuit network model, a likely value calculated by a maximum-likelihood method based on the first and second measurement values by using:

the first coefficient calculated based on the first measurement value as an initial value of the coefficient of the relative error correction circuit network model corresponding to a first coefficient of a first relative error correction circuit network submodel derived by assuming that, in each of the reference jig and the test jig, there exists, for all pairs of two ports selected only from among the signal line ports, the leak signal not transferred to the electric component connected with the two ports but directly transferred between the two ports, in addition to a signal transferred within each signal line port;

the second coefficient calculated based on the second measurement value as an initial value of the coefficient of the relative error correction circuit network model corresponding to a second coefficient other than the coefficient corresponding to the first coefficient among the relative error correction circuit network models corresponding to a coefficient for the non signal line port of a second relative error correction circuit network submodel derived by assuming that, in each of the reference jig and the test jig, there exists a signal reflected at the non signal line port in addition to the assumption for the first relative error correction circuit network model; and predetermined values as initial values of the other coefficients of the relative error correction circuit network model.

* * * * *